US 9,468,115 B2

(12) United States Patent
Tozawa (10) Patent No.: US 9,468,115 B2
(45) Date of Patent: Oct. 11, 2016

(54) PARTITION BOARD, AND METHOD OF RESTRAINING ELECTRICAL STORAGE ELEMENTS

(71) Applicant: Takanori Tozawa, Nissin (JP)

(72) Inventor: Takanori Tozawa, Nissin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 378 days.

(21) Appl. No.: 13/946,376

(22) Filed: Jul. 19, 2013

(65) Prior Publication Data

US 2014/0041901 A1    Feb. 13, 2014

(30) Foreign Application Priority Data

Aug. 10, 2012  (JP) ................. 2012-178203

(51) Int. Cl.
| | |
|---|---|
| *H05K 5/02* | (2006.01) |
| *H01M 2/18* | (2006.01) |
| *H01M 10/04* | (2006.01) |
| *H01M 2/10* | (2006.01) |
| *H01M 2/14* | (2006.01) |

(52) U.S. Cl.
CPC ........... *H05K 5/026* (2013.01); *H01M 2/1077* (2013.01); *H01M 2/18* (2013.01); *H01M 10/04* (2013.01); *H05K 5/0291* (2013.01); *H01M 2/14* (2013.01); *Y10T 29/49108* (2015.01)

(58) Field of Classification Search
CPC ............. H05K 5/0291; H05K 5/0256; H05K 5/0286; H05K 5/026; H05K 5/0226; H05K 5/0282
See application file for complete search history.

(56) References Cited

U.S. PATENT DOCUMENTS

| | | | | |
|---|---|---|---|---|
| 4,990,097 | A | * | 2/1991 | Billman et al. ............... 439/160 |
| 2012/0052359 | A1 | | 3/2012 | Yoshitake et al. |
| 2012/0321926 | A1 | | 12/2012 | Hojo |

FOREIGN PATENT DOCUMENTS

| | | |
|---|---|---|
| CN | 201868514 U | 6/2011 |
| CN | 102422458 A | 4/2012 |
| JP | A-2011-23266 | 2/2011 |
| WO | WO 2010/131700 A1 | 11/2010 |
| WO | WO 2011/111153 A1 | 9/2011 |

* cited by examiner

*Primary Examiner* — Jeremy C Norris
(74) *Attorney, Agent, or Firm* — Oliff PLC (57) ABSTRACT

A partition board that is arranged between two electrical storage elements that are arranged adjacent to each other in a predetermined direction (X direction) includes a guide portion, a first pin and a second pin. The guide portion is used to cause the partition board to move in the predetermined direction when each electrical storage element is arranged onto the partition board. The first pin protrudes in the predetermined direction, and is used to position the partition board in the predetermined direction. The second pin is provided at a location different in a top to bottom direction of the partition board from a location at which the first pin is provided, and protrudes in the same direction as the direction in which the first pin protrudes.

11 Claims, 6 Drawing Sheets

PARTITION BOARD, AND METHOD OF RESTRAINING ELECTRICAL STORAGE ELEMENTS

INCORPORATION BY REFERENCE

The disclosure of Japanese Patent Application No. 2012-178203 filed on Aug. 10, 2012 including the specification, drawings and abstract is incorporated herein by reference in its entirety.

BACKGROUND OF THE INVENTION

1. Field of the Invention

The invention relates to a partition board that is used in an electrical storage device in which a plurality of electrical storage elements are arranged in a predetermined direction and that is arranged between any adjacent two of the electrical storage elements in the predetermined direction.

2. Description of Related Art

When a battery pack is formed of a plurality of secondary batteries, the plurality of secondary batteries may be arranged in a predetermined direction, and a partition board may be arranged between any adjacent two of the secondary batteries. Here, a pair of end plates are respectively arranged at both end portions of the battery pack in the predetermined direction, and restraint force is applied to the plurality of secondary batteries and the plurality of partition boards with the use of the end plates.

International Application Publication No. 2011/111153 (WO2011/111153) describes a processing device for inspecting secondary batteries before shipment. In the processing device, the secondary batteries each are arranged between any two of a plurality of restraining portions arranged in a predetermined direction, and contact pressure is applied to the secondary batteries with the use of the restraining portions. After contact pressure has been applied to the secondary batteries, the secondary batteries are charged for the first time.

When the secondary batteries are inspected as in the case of WO2011/111153, for example, a plurality of partition boards that constitute a battery pack may be arranged in the predetermined direction in advance, and then each secondary battery may be inserted between any adjacent two of the partition boards arranged in the predetermined direction. Here, when the secondary batteries are inserted, the clearance between any adjacent two of the partition boards needs to be uniformed while sliding the plurality of partition boards in the predetermined direction. However, when the partition boards are slid in the predetermined direction, there is a concern that the partition boards incline with respect to the predetermined direction.

SUMMARY OF THE INVENTION

A first aspect of the invention provides a partition board to be arranged between two electrical storage elements that are arranged adjacent to each other in a predetermined direction. The partition board includes a guide portion, a first pin and a second pin. The guide portion is configured to cause the partition board to move in the predetermined direction when each electrical storage element is arranged onto the partition board.

The first pin protrudes in the predetermined direction, and is configured to position the partition board in the predetermined direction. That is, it is possible to position the partition board by bringing the first pin into contact with another member. The second pin is provided at a location different in a top to bottom direction of the partition board from a location at which the first pin is provided, and protrudes in the same direction as the direction in which the first pin protrudes.

According to the first aspect of the invention, it is possible to position the partition board in the predetermined direction with the use of the first pin. That is, it is possible to position the partition board by bringing the first pin into contact with another member. Specifically, when a plurality of the partition boards are arranged in the predetermined direction, it is possible to position each partition board by bringing the first pin of each partition board into contact with another adjacent one of the partition boards in the predetermined direction. In this way, by positioning the partition board in advance, it becomes easy to arrange each electrical storage element onto the partition board.

When the partition board is caused to move in the predetermined direction with the use of the guide portion, there is a concern that the partition board inclines with respect to the predetermined direction. Inclination of the partition board means a slant of the upper portion of the partition board downward of the partition board. When the partition board is caused to move in the predetermined direction, for example, the guide portion of the partition board is caused to move along a member (part of a jig) that extends in the predetermined direction. At this time, depending on a contact state between the guide portion and the jig, there is a concern that the partition board inclines.

According to the first aspect of the invention, it is possible to suppress inclination of the partition board with the use of the second pin provided at a location different from a location at which the first pin is provided. That is, even when the partition board attempts to incline, it is possible to suppress inclination of the partition board by the contact of the second pin with another member. Specifically, in the case where a plurality of the partition boards are arranged in the predetermined direction, when any one of the partition boards attempts to incline, it is possible to suppress inclination of the any one of the partition boards by bringing the second pin of the any one of the partition boards into contact with another adjacent one of the partition boards.

The guide portion and the second pin may respectively have surfaces at grade, the surfaces extending in the predetermined direction. That is, the second pin may be provided at a location adjacent to the guide portion in the predetermined direction. Thus, it is possible to cause the partition board to move in the predetermined direction with the use of the guide portion and the second pin, and it becomes easy to suppress inclination of the partition board with respect to the predetermined direction.

The length of the first pin in the predetermined direction may be equal to the length of the second pin in the predetermined direction. Thus, it is possible to position the partition board in the predetermined direction with the use of not only the first pin but also the second pin. Here, the second pin may have the function of suppressing inclination of the partition board in the predetermined direction and the function of positioning the partition board in the predetermined direction.

The length of each of the first pin and the second pin in the predetermined direction may be smaller than the thickness of each electrical storage element in the predetermined direction. The partition boards according to the first aspect of the invention are arranged in the predetermined direction, and the first pin and second pin of each partition board contact another adjacent one of the partition boards in the predetermined direction. Thus, it is possible to regulate the clearance between any adjacent two of the partition boards in the predetermined direction.

Here, when the length of each of the first pin and the second pin in the predetermined direction is smaller than the thickness of each electrical storage element in the predetermined direction, each electrical storage element is inserted into between adjacent two of the partition boards in the predetermined direction only after the clearance between the adjacent two of the partition boards has been expanded. When the clearance between adjacent two of the partition boards is expanded in a state where the clearance between the adjacent two of the partition boards has been regulated with the use of the first pin and the second pin, it is possible to expand the clearance between the adjacent two of the partition boards in a state where the clearance between any adjacent two of the partition boards is uniform among at least three partition boards. Then, it is possible to insert each electrical storage element into between the adjacent two of the partition boards in a state where the clearance between any adjacent two of the partition boards is uniform.

The partition board may have a plurality of the first pins and a plurality of the second pins. Here, the center of gravity of the partition board may be located within a region surrounded by the plurality of first pins and the plurality of second pins. The region surrounded by the plurality of first pins and the plurality of second pins is one region surrounded by straight lines that connect the first pins and the second pins.

With this configuration, it is possible to suppress inclination of the partition board about the center of gravity by using at least one of the plurality of first pins and the plurality of second pins. That is, when the partition board attempts to incline about the center of gravity, it is possible to inhibit inclination of the partition board by the contact of the first pins or the second pins with another member.

The first aspect of the invention of the partition board to be arranged between two electrical storage elements that are arranged adjacent to each other in a predetermined direction may include: a board body; a lower arm portion provided at lower peripheral portion of the board body; an upper arm portion provided at upper peripheral portion of the board body: a first pin protruding from the lower arm portion in the predetermined direction; and a second pin protruding from the upper arm portion in the predetermined direction.

A second aspect of the invention provides a method of restraining a plurality of electrical storage elements arranged in a predetermined direction in an electrical storage device that includes the plurality of electrical storage elements and a plurality of partition boards, each of which is arranged between any adjacent two of the electrical storage elements in the predetermined direction. The restraining method includes: regulating a clearance between the any adjacent two of the partition boards in the predetermined direction with the use of the first pin provided at each of the partition boards; inserting each electrical storage element into between the any adjacent two of the partition boards in the predetermined direction; and applying restraint force in the predetermined direction to the electrical storage elements.

Here, when each of the partition boards is caused to move in the predetermined direction with the use of a guide portion provided at each of the partition boards, inclination of each partition board with respect to the predetermined direction is suppressed with the use of a second pin that is provided at a location different in a top to bottom direction of each partition board from a location at which the first pin is provided and that protrudes in the same direction as the direction in which the first pin protrudes. According to the second aspect of the invention as well, it is possible to obtain advantageous effects similar to those of the first aspect of the invention.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, an embodiment of the invention will be described.

Figure 1:
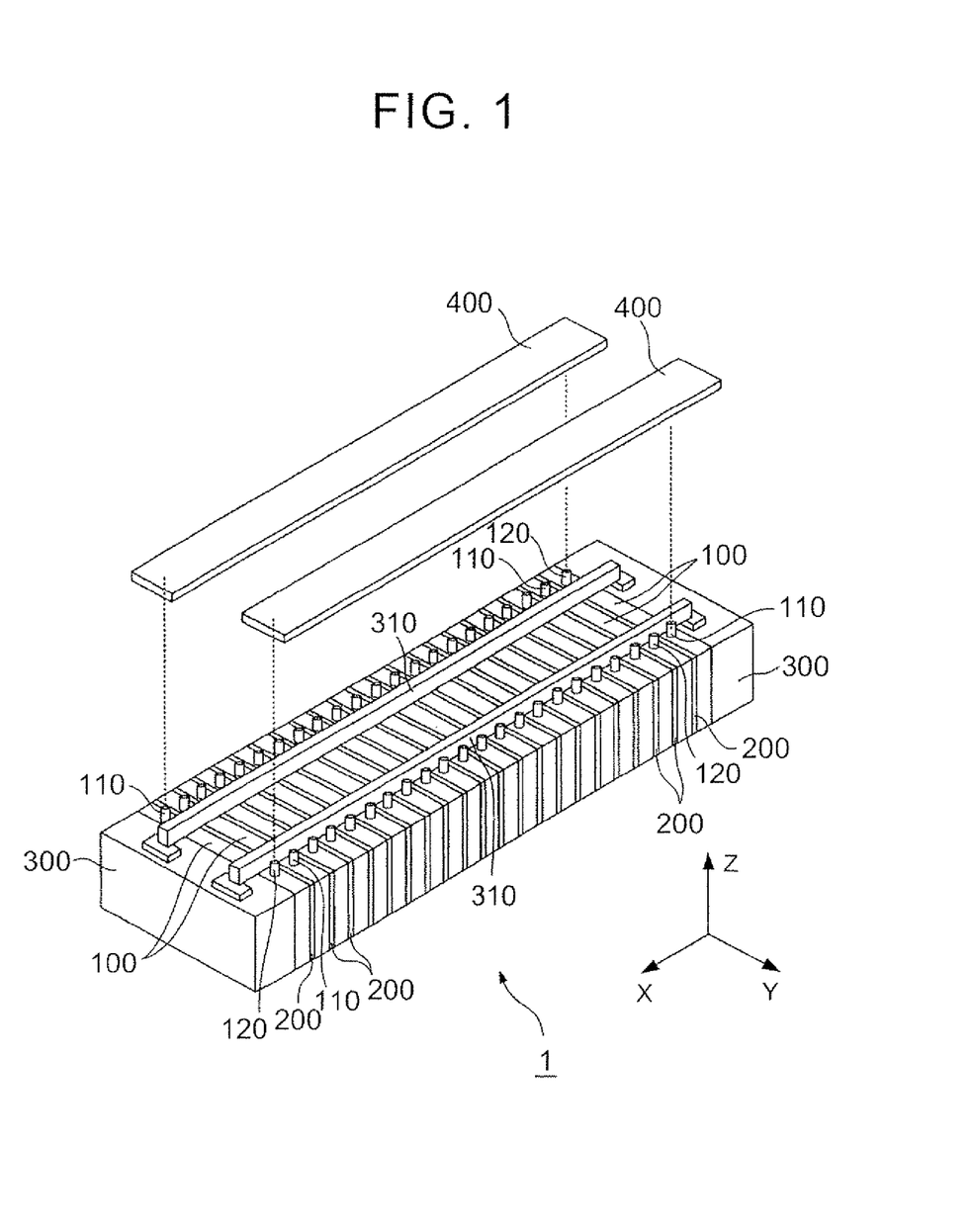
FIG. 1 is a schematic view of a battery stack.

A battery stack (which corresponds to an electrical storage device) according to a first embodiment of the invention will be described with reference to FIG. 1. FIG. 1 is an external view of the battery stack according to the present embodiment. In FIG. 1, the X-axis, the Y-axis and the Z-axis are axes perpendicular to one another, and, in the present embodiment, the axis that corresponds to a vertical direction is set to the Z-axis. The relationship among the X-axis, the Y-axis and the Z-axis is the same in the other drawings.

The battery stack 1 shown in FIG. 1 may be, for example, mounted on a vehicle. The vehicle may be a hybrid vehicle or an electric vehicle. The hybrid vehicle includes a power source, such as a fuel cell and an engine, in addition to the battery stack 1 as a power source for propelling the vehicle. The electric vehicle includes only the battery stack 1 as the power source for propelling the vehicle.

In the vehicle that includes the battery stack 1, it is possible to convert electric energy, output from the battery stack 1, to kinetic energy and to propel the vehicle using the kinetic energy. Specifically, a motor generator converts electric energy, output from the battery stack 1, to kinetic energy, and the kinetic energy generated by the motor generator is transmitted to a wheel. Thus, it is possible to propel the vehicle.

When the battery stack 1 is mounted on the vehicle, it is possible to accommodate the battery stack 1 in a stack case. Then, it is possible to fix the stack case to the body of the vehicle.

The battery stack 1 includes a plurality of single cells (which correspond to electrical storage elements) 100. The plurality of single cells 100 are arranged in the X direction. The number of the single cells 100 may be set as needed on the basis of for example, a required output of the battery stack 1. Each single cell 100 may be a secondary battery, such as a nickel metal hydride battery and a lithium ion battery. Instead of the secondary battery, an electric double layer capacitor may be used.

In the present embodiment, the plurality of single cells 100 are arranged in the X direction; however, the arrangement is not limited to this configuration. Specifically, it is also applicable that each single battery module is formed by electrically connecting a plurality of single cells in series with one another and then a plurality of the battery modules are arranged in the X direction.

Figure 2:
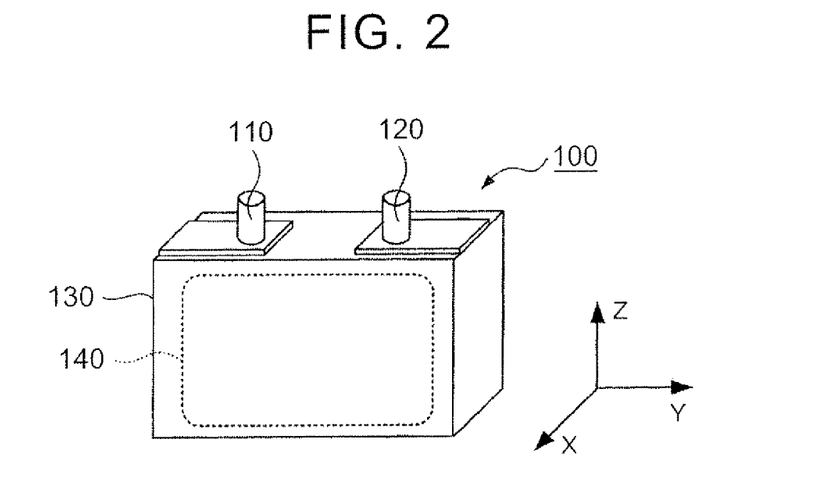
FIG. 2 is an external view of a single cell.

As shown in FIG. 2, each single cell 100 includes a battery case 130, and the battery case 130 may be, for example, made of a metal. Each single cell 100 is a so-called square battery. In the square single cell 100, the battery case 130 is formed in a rectangular parallelepiped shape. The inside of the battery case 130 is hermetically sealed, and a power generating element 140 is arranged inside the battery case 130.

The power generating element 140 is an element that is charged or discharged. The power generating element 140 includes a positive electrode element, a negative electrode element, and a separator arranged between the positive electrode element and the negative electrode element. The positive electrode element has a current collector and a positive electrode active material layer formed on the surface of the current collector. The negative electrode element has a current collector and a negative electrode active material layer formed on the surface of the current collector.

An electrolytic solution is impregnated in the positive electrode active material layer, the negative electrode active material layer and the separator. Instead of the electrolytic solution, a solid electrolyte may be used. When a solid electrolyte is used, the separator is omitted, and a solid electrolyte layer is arranged between the positive electrode element and the negative electrode element.

A positive electrode terminal 110 and a negative electrode terminal 120 are provided on the upper face of the battery case 130. The positive electrode terminal 110 is electrically connected to the positive electrode element of the power generating element 140, and the negative electrode terminal 120 is electrically connected to the negative electrode element of the power generating element 140. Here, the positive electrode terminal 110 and the negative electrode terminal 120 just need to be exposed to the outer face of the battery case 130, and the location at which the positive electrode terminal 110 and the negative electrode terminal 120 are provided may be set as needed. For example, the positive electrode terminal 110 and the negative electrode terminal 120 may be provided on the side face (side face perpendicular to the Y direction) of the battery case 130.

In the battery stack 1 shown in FIG. 1, the plurality of single cells 100 arranged in the X direction are electrically connected in series with one another by a bus bar module 400. The bus bar module 400 includes a plurality of bus bars and a holder that holds the plurality of bus bars. The holder may be made of an insulating material, such as a resin. Each bus bar is connected to the positive electrode terminal 110 in one of any adjacent two of the single cells 100 in the X direction, and is connected to the negative electrode terminal 120 in the other one of the any adjacent two of the single cells 100 in the X direction. Thus, the plurality of single cells 100 are electrically connected in series with one another.

In the present embodiment, all the single cells 100 are electrically connected in series with one another; however, it is not limited to this configuration. Specifically, the plurality of single cells 100 that are electrically connected in parallel with one another may be included in the battery stack 1. In this case, by appropriately changing the shape of each bus bar, it is possible to electrically connect the plurality of single cells 100 in parallel with one another.

A pair of end plates 300 are respectively arranged at both ends of the battery stack 1 in the X direction. That is, the pair of end plates 300 sandwich the plurality of single cells 100 in the X direction. Bands 310 extend in the X direction. Both longitudinal ends of each of the bands 310 are respectively fixed to the pair of end plates 300.

The bands 310 may be, for example, made of a metal. In the present embodiment, the two bands 310 are arranged on the upper face of the battery stack 1. Although not shown in FIG. 1, two bands 310 are also arranged on the lower face of the battery stack 1.

By fixing the bands 310 to the pair of end plates 300, it is possible to apply restraint force to the plurality of single cells 100 that constitute the battery stack 1. Restraint force is force that sandwiches the plurality of single cells 100 in the X direction. By applying restraint force to the single cells 100, it is possible to, for example, suppress expansion of the single cells 100.

In the lithium ion secondary battery that serves as each single cell 100, the power generating element 140 repeats expansion and contraction through charging and discharging. Here, expansion and contraction of each single cell 100 (power generating element 140) are suppressed by applying restraint force to each single cell 100. Thus, it is possible to suppress a decrease in the input/output performance of each single cell 100 (power generating element 140) with expansion and contraction of each single cell 100 (power generating element 140).

In the present embodiment, the two bands 310 are arranged on the upper face of the battery stack 1 and the two bands 310 are arranged on the lower face of the battery stack 1; however, it is not limited to this configuration. That is, it is just required to be able to apply restraint force to the single cells 100 by fixing the bands 310 to the pair of end plates 300. Therefore, the number of the bands 310 and the locations at which the bands 310 are provided may be set as needed.

A partition board 200 is arranged between any adjacent two of the single cells 100 in the X direction. Each partition board 200 may be, for example, made of an insulating material, such as a resin. By using the partition boards 200 made of an insulating material, it is possible to electrically insulate any adjacent two of the single cells 100 in the X direction.

Figure 3:
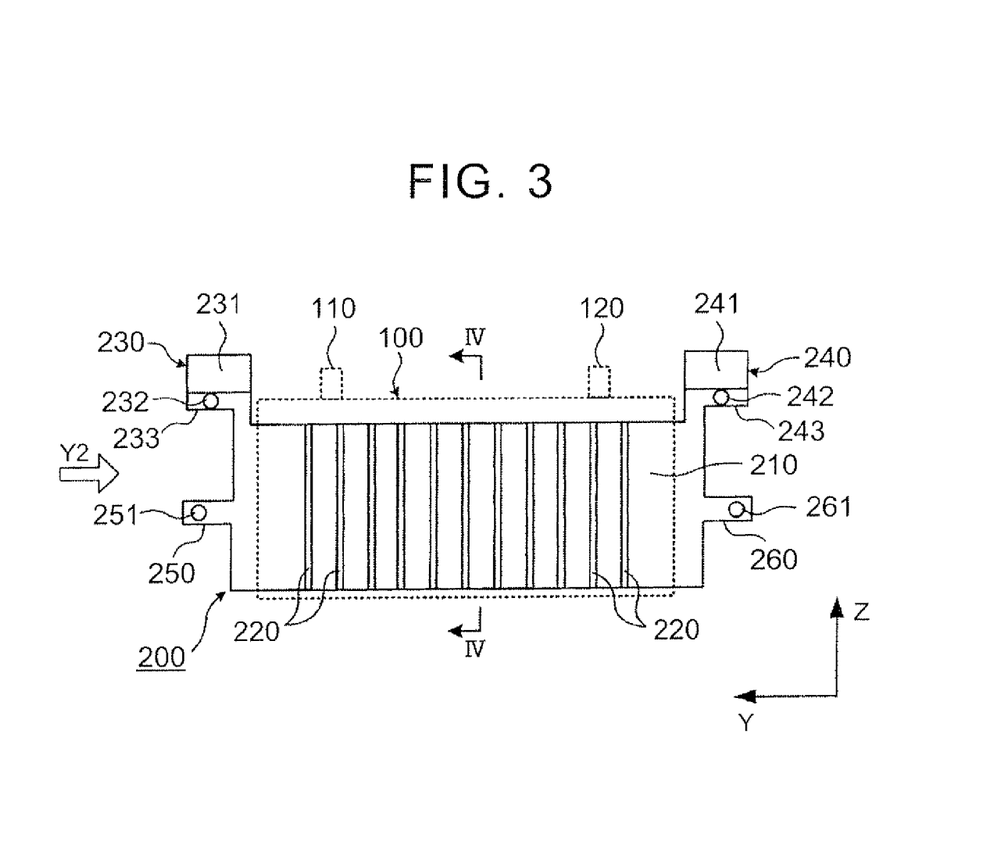
FIG. 3 is a front view of a partition board.

FIG. 3 is a view (front view) of the partition board 200 when viewed in the X direction. Here, FIG. 1 is a schematic view of the battery stack 1. FIG. 1 shows the positional relationship among the single cells 100 and the partition boards 200. Here, each partition board 200 is specifically formed into a shape shown in FIG. 3. The dashed line shown in FIG. 3 indicates the position of the single cell 100 when the single cell 100 is arranged onto the partition board 200.

Figure 4:
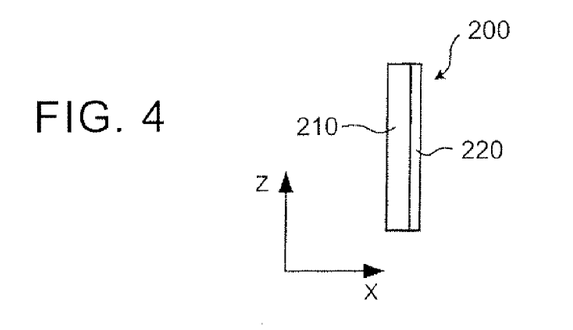
FIG. 4 is a cross-sectional view taken along the line IV-IV in FIG. 3.

Each partition board 200 has a board body 210, and the board body 210 has a plurality of protrusions 220. The plurality of protrusions 220 are arranged in the Y direction, and each protrusion 220 protrudes from the board body 210 in the X direction as shown in FIG. 4. Here, FIG. 4 is a cross-sectional view that is taken along the line IV-IV in FIG. 3. By forming the protrusions 220 in this way, it is possible to form space between any adjacent two of the protrusions 220 in the Y direction.

The distal end of each protrusion 220 in the X direction contacts the single cell 100. Thus, space is formed between each partition board 200 and a corresponding one of the single cells 100, that is, a region in which no protrusion 220 is provided. This space is used as a passage through which a heat exchange medium that is used to adjust the temperature of the single cell 100 flows. The heat exchange medium may be a gas or a liquid.

When cooling heat exchange medium is introduced into the space formed between each partition board 200 and a corresponding one of the single cells 100, it is possible to cool the single cells 100 through heat exchange between the heat exchange medium and the single cells 100. When warming heat exchange medium is introduced into the space formed between each partition board 200 and a corresponding one of the single cells 100, it is possible to warm the single cells 100 through heat exchange between the heat exchange medium and the single cells 100.

In the present embodiment, the protrusions 220 are formed in the shape shown in FIG. 3; however, the shape is not limited to the shape shown in FIG. 3. That is, it is just required to be able to form space between each partition board 200 and a corresponding one of the single cells 100 using the protrusions 220. Here, the protrusions 220 just need to protrude in the X direction with respect to the board body 210. Within a plane (Y-Z plane) shown in FIG. 3, the shape of each of the protrusions 220 and the locations of the protrusions 220 may be set as needed.

A first arm portion 230 and a second arm portion 240 are provided at the upper portion of the board body 210. The first arm portion 230 and the second arm portion 240 are respectively located at both ends of the board body 210 in the Y direction. That is, the first arm portion 230 and the second aim portion 240 are provided at the same location (height) in the Z direction.

Figure 5:
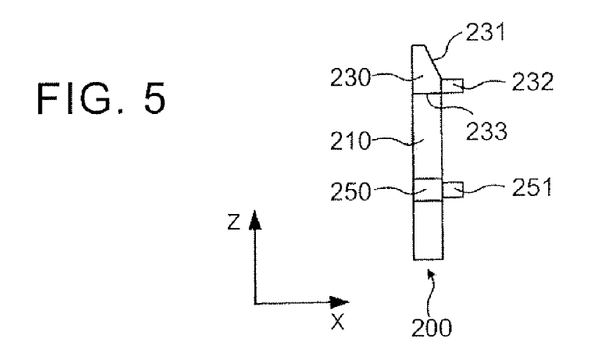
FIG. 5 is a view when the partition board is viewed in the arrow Y2 direction in FIG. 3.

The first arm portion 230 has an inclined surface 231. As shown in FIG. 5, the inclined surface 231 is inclined with respect to the X-axis. FIG. 5 is a view (side view) of each partition board 200 when viewed in the arrow Y2 direction in FIG. 3. As will be described later, the inclined surface 231 is used when each single cell 100 is assembled into between any adjacent two of the partition boards 200 in the X direction.

A pin (which corresponds to a second pin) 232 protrudes from the first arm portion 230 in the X direction. The pin 232 is provided within the same plane as a guide surface (which corresponds to a guide portion) 233 that is located at the lower end of the first arm portion 230. That is, the outer periphery (lower surface) of the pin 232 and the guide surface 233 are formed of a continuous surface. As will be described later, the guide surface 233 is used to slide the partition board 200 in the X direction.

The second arm portion 240 has a similar configuration to the first arm portion 230, and has an inclined surface 241. The inclined surface 241 is inclined with respect to the X-axis, and a pin (which corresponds to a second pin) 242 protrudes from the second arm portion 240 in the X direction. The pin 242 is provided in the same plane as a guide surface (which corresponds to a guide portion) 243 that is located at the lower end of the second arm portion 240. That is, the outer periphery (lower surface) of the pin 242 and the guide surface 243 are formed of a continuous surface. As will be described later, the guide surface 243 is used to slide the partition board 200 in the X direction.

A third arm portion 250 is located below the first arm portion 230. The third arm portion 250 protrudes from the board body 210 in the Y direction, and the third arm portion 250 has a pin (which corresponds to a first pin) 251 that protrudes in the X direction. Here, the protruding direction of the pin 251 with respect to the third arm portion 250 is the same as the protruding direction of the pin 232 with respect to the first arm portion 230. In other words, the pins 232, 251 are located within the same plane (Y-Z plane).

A fourth arm portion 260 is provided below the second arm portion 240. The fourth arm portion 260 protrudes from the board body 210 in the Y direction, and the fourth arm portion 260 has a pin (which corresponds to a first pin) 261 that protrudes in the X direction. Here, the protruding direction of the pin 261 with respect to the fourth arm portion 260 is the same as the protruding direction of the pin 242 with respect to the second arm portion 240. In other words, the pins 242, 261 are located within the same plane (Y-Z plane).

The third arm portion 250 and the fourth arm portion 260 are provided at the same position (height) in the Z direction. As described above, the four pins 232, 242, 251, 261 are provided on the same side (right side in FIG. 5) with respect to the board body 210, and are located within the same plane (Y-Z plane). In addition, the lengths (protruding amounts) of the four pins 232, 242, 251, 261 in the X direction are equal to one another. Alternatively, the lengths of the pins 232, 242 in the X direction may be smaller than the lengths of the pins 251, 261 in the X direction.

Figure 6:
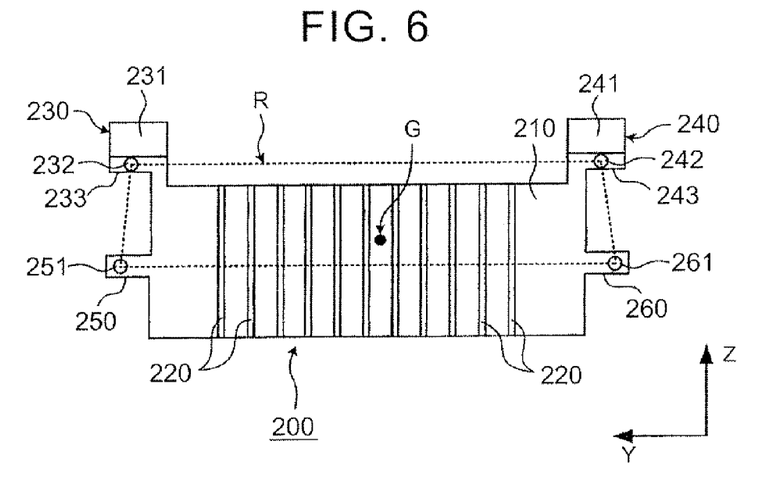
FIG. 6 is a view that shows the relationship among four pins provided at the partition board and the center of gravity of the partition board.

As shown in FIG. 6, the center of gravity G of the partition board 200 is located inside a region R surrounded by the four pins 232, 242, 251, 261. Specifically, the center of gravity G is located between a straight line that connects the pins 232, 242 and a straight line that connects the pins 251, 261. In addition, the center of gravity G is located between a straight line that connects the pins 232, 251 and a straight line that connects the pins 242, 261. FIG. 6 is a view corresponding to FIG. 3. Here, the center of gravity G of the partition board 200 just needs to be located inside the region R or at the outer edge of the region R. The outer edge of the region R is a portion indicated by the dashed line in FIG. 6.

The center of gravity G of the partition board 200 is located inside the region R. Thus, it is possible to efficiently suppress a slant of the partition board 200. When the center of gravity G of the partition board 200 is located outside the region R, there is a concern that the partition board 200 inclines even when the pins 232, 242, 251, 261 are provided. That is, the partition board 200 tends to incline about the center of gravity G. Therefore, when the center of gravity G is located inside the region R, it is possible to efficiently suppress inclination of the partition board 200 about the center of gravity G with the use of the pins 232, 242, 251, 261.

Next, part of a process of applying restraint force to the single cells 100 in order to inspect the single cells 100 will be described. Here, a process until each single cell 100 is inserted into between any adjacent two of the partition boards 200 in the X direction will be described. After each single cell 100 has been inserted into between any adjacent two of the partition boards 200 in the X direction, restraint force is applied to the single cells 100. The restraint force is force that sandwiches the single cells 100 in the X direction. On the other hand, after restraint force has been applied to the single cells 100, the single cells 100 are charged for the first time.

Figure 7:
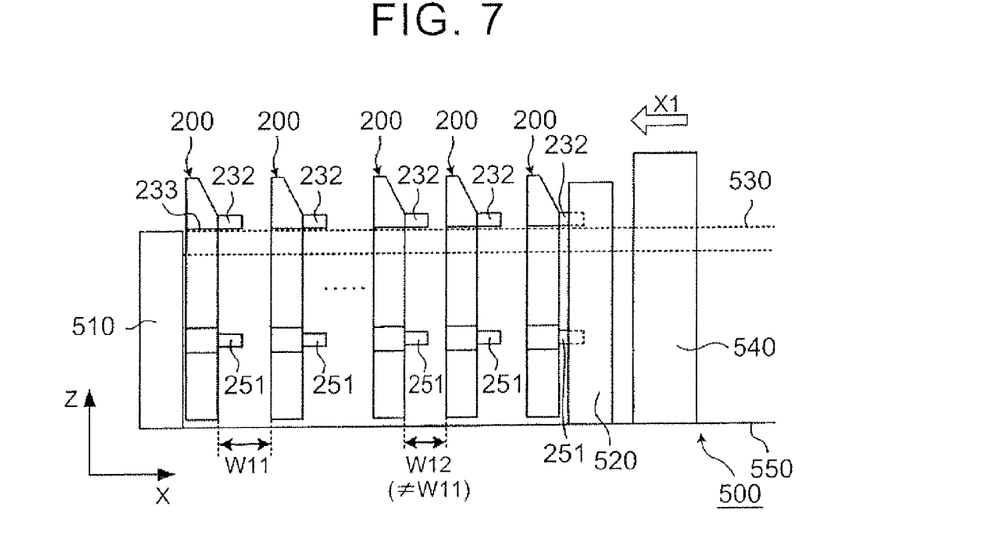
FIG. 7 is a view that shows a state immediately after a plurality of the partition boards are assembled to a restraining jig.

Initially, the plurality of partition boards 200 are arranged on a restraining jig 500 shown in FIG. 7. When the plurality of partition boards 200 are arranged, the partition boards 200 are arranged such that the orientation of each partition board 200 is the same. That is, as shown in FIG. 7, each partition board 200 is arranged such that the pins 232, 251 are located on the right side with respect to the board body 210.

Here, when the plurality of partition boards 200 are just arranged on the restraining jig 500, there are variations in the clearance between any adjacent two of the partition boards 200 in the X direction. For example, as shown in FIG. 7, there are the two partition boards 200 that are arranged at the clearance W11, and there are the two partition boards 200 that are arranged at the clearance W12. Here, the clearances W11, W12 are different from each other.

A first stopper 510 and a second stopper 520 are respectively arranged at both ends of the restraining jig 500 in the X direction. The first stopper 510 is fixed, but the second stopper 520 is movable in the X direction. The plurality of partition boards 200 are arranged between the first stopper 510 and the second stopper 520. Here, the second stopper 520 has grooves into which the pins 232, 242, 251, 261 of the partition board 200 are inserted.

The restraining jig 500 has a pair of guide members 530 that extend in the X direction. The pair of guide members 530 are arranged at locations so as to sandwich the partition boards 200 in the Y direction. In FIG. 7, only one of the guide members 530 is indicated by the dashed line. The guide members 530 are used to slide the partition boards 200 in the X direction.

The guide surface 233 of each first arm portion 230 contacts an upper end portion of one of the guide members 530, and the guide surface 243 of each second arm portion 240 contacts an upper end portion of the other one of the guide members 530. Thus, the guide surfaces 233, 243 are able to move along the guide members 530, and are able to slide the partition boards 200 in the X direction.

Here, each pin 232 has a surface continuous with the guide surface 233, so each pin 232 also contacts the corresponding guide member 530. In addition, each pin 242 has a surface continuous with the guide surface 243, so each pin 242 also contacts the corresponding guide member 530. Thus, when the partition boards 200 are slid in the X direction, the pins 232, 242 also move along the corresponding guide members 530.

When the guide surfaces 233, 243 respectively contact the guide members 530, the bottom surface of each partition board 200 is spaced upward from a bottom surface 550 of the restraining jig 500. That is, the partition boards 200 are supported by only the pair of guide members 530.

As shown in FIG. 7, after the plurality of partition boards 200 have been arranged on the restraining jig 500, an arm 540 of the restraining jig 500 is moved in the arrow X1 direction. The arm 540 pushes the second stopper 520 in the arrow X1 direction to slide the plurality of partition boards 200 in the arrow X1 direction. Here, the guide surfaces 233, 243 of each partition board 200 move along the guide members 530.

The fixed first stopper 510 is arranged at one end of the restraining jig 500, so the first stopper 510 inhibits movement of the partition boards 200 in the arrow X1 direction. Thus, the plurality of partition boards 200 are placed in a state shown in FIG. 8.

Figure 8:
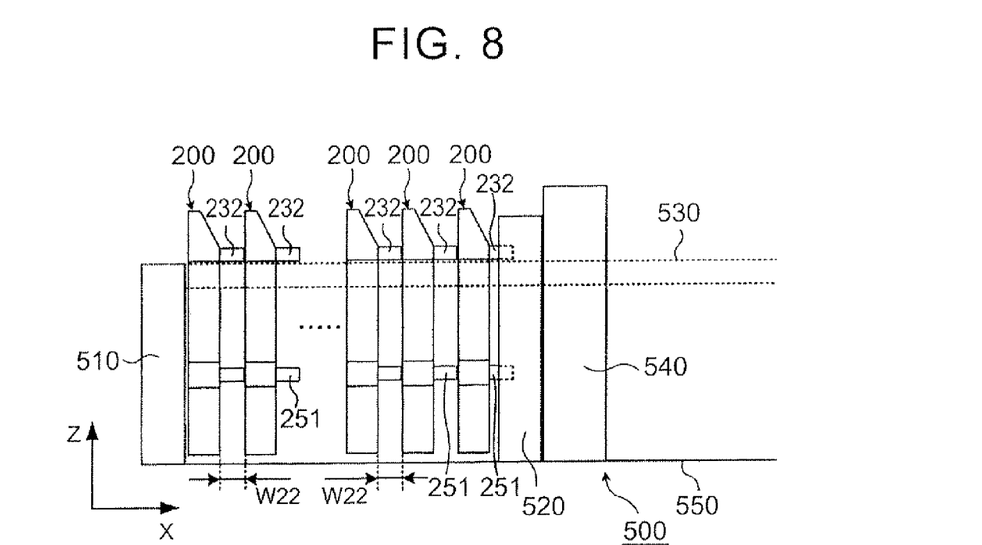
FIG. 8 is a view that shows a state after the plurality of partition boards have been positioned with the use of the restraining jig.

In the state shown in FIG. 8, the pins 232, 242, 251, 261 of each partition board 200 contact another adjacent one of the partition boards 200 (board bodies 210) in the X direction. The length of each of the pins 232, 242, 251, 261 in the X direction is equal to one another, so the distal ends of all the pins 232, 242, 251, 261 contact another adjacent one of the partition boards 200.

By bringing the pins 232, 242, 251, 261 of each partition board 200 into contact with another adjacent one of the partition boards 200, it is possible to uniform the clearance between any adjacent two of the partition boards 200 in the X direction. Specifically, the clearance between any adjacent two of the partition boards 200 in the X direction is uniformly set to the clearance W22. The clearance W22 corresponds to the length of each of the pins 232, 242, 251, 261 in the X direction. By uniforming the clearance between any adjacent two of the partition boards 200 in the X direction, it is possible to position the plurality of partition boards 200 in the X direction.

Here, in the present embodiment, the cross-sectional shape of each of the pins 232, 242, 251, 261, taken perpendicularly to the longitudinal direction thereof, is a circular shape; however, the cross-sectional shape is not limited to the circular shape. That is, it is just required to be able to uniform the clearance between any adjacent two of the partition boards 200 in the X direction with the use of the pins 232, 242, 251, 261, and the cross-sectional shape of each of the pins 232, 242, 251, 261 may be set as needed. Here, the distal ends of the pins 232, 242, 251, 261 each desirably have a flat surface (flat surface perpendicular to the X direction) so as to be able to easily position the partition board 200.

By bringing the four pins 232, 242, 251, 261 provided at mutually different positions into contact with another adjacent one of the partition boards 200, it becomes easy to position each partition board 200 within the plane (Y-Z plane) perpendicular to the X direction. That is, it is possible to suppress inclination of each partition board 200 with respect to the X-axis. Here, as shown in FIG. 6, the center of gravity G of each partition board 200 is located inside the region R. Thus, it is possible to inhibit inclination of each partition board 200 about the center of gravity G with the use of the four pins 232, 242, 251, 261.

When each partition board 200 is formed of a resin, it is possible to improve the machining accuracy of the pins 232, 242, 251, 261, and it becomes easy to uniform the length of each of the pins 232, 242, 251, 261 in the X direction. Thus, within the plane (Y-Z plane) perpendicular to the X direction, it is possible to accurately position the partition boards 200.

When each partition board 200 is formed of a resin, it is possible to improve the machining accuracy of each partition board 200, and it is possible to suppress variations in dimensions among the plurality of partition boards 200. Specifically, it is possible to suppress variations in the length of each of the pins 232, 242, 251, 261 among the plurality of partition boards 200. Thus, it is possible to accurately uniform the clearance between any adjacent two of the partition boards 200 in the X direction.

Figure 9:
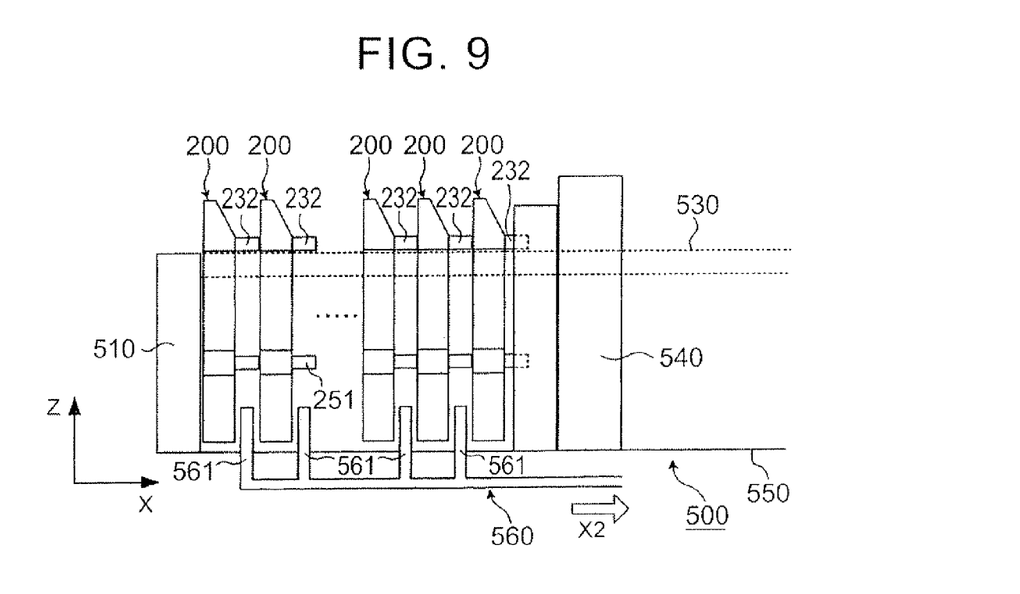
FIG. 9 is a view that illustrates a process of expanding the clearance between any adjacent two of the partition boards.

After the plurality of partition boards 200 have been placed in the state shown in FIG. 8, the clearance between any adjacent two of the partition boards 200 in the X direction is expanded with the use of an arm 560 of the restraining jig 500 shown in FIG. 9. The arm 560 has a plurality of sub-arms 561. The plurality of sub-arms 561 are arranged in the X direction. Each sub-arm 561 is movable independently in the X direction.

Each sub-arm 561 is inserted into between any adjacent two of the partition boards 200 in the X direction, and is placed in the state shown in FIG. 9. In the state shown in FIG. 9, when each sub-arm 561 is moved in the arrow X2 direction, it is possible to expand the clearance between the corresponding adjacent two of the partition boards 200 in the X direction. For example, when each sub-arm 561 is moved in the arrow X2 direction in order from the side close to the first stopper 510, it is possible to expand the clearance between the corresponding adjacent two of the partition boards 200 in the X direction in order from the side close to the first stopper 510.

When all the sub-arms 561 have been moved in the arrow X2 direction, the clearance between any adjacent two of the partition boards 200 in the X direction remains uniform. However, the clearance between any adjacent two of the partition boards 200 is wider than the clearance W22 shown in FIG. 8. Here, the pins 232, 242, 251, 261 of each partition board 200 are spaced apart from another adjacent one of the partition boards 200 (board bodies 210) in the X direction.

Before the clearance between any adjacent two of the partition boards 200 is expanded with the use of the sub-arms 561, the clearance between any adjacent two of the partition boards 200 is uniformed as shown in FIG. 8. Thus, it is possible to expand the clearance between any adjacent two of the partition boards 200 in a state where the clearance between any adjacent two of the partition boards 200 is uniform. Here, the clearance between any adjacent two of the partition boards 200 is expanded to a clearance corresponding to the thickness of each single cell 100 in the X direction.

Figure 10:
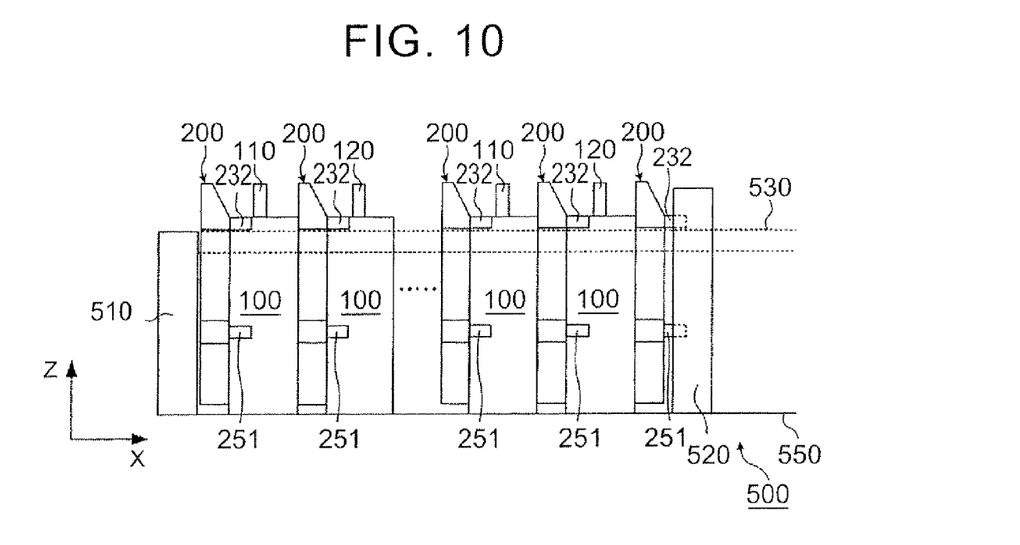
FIG. 10 is a view that shows a state where the single cells are assembled to the restraining jig.

After the clearance between any adjacent two of the partition boards 200 has been expanded, each single cell 100 is inserted into between any adjacent two of the partition boards 200 as shown in FIG. 10. Specifically, each single cell 100 is inserted from above the partition boards 200. Here, the thickness of each single cell 100 in the X direction is larger than the length of each of the pins 232, 242, 251, 261 in the X direction.

In the present embodiment, the inclined surfaces 231, 241 facing upward of the partition board 200 are formed at the upper portion of each partition board 200. Therefore, it is possible to make it easy to insert each single cell 100 with the use of the inclined surfaces 231, 241.

Figure 11:
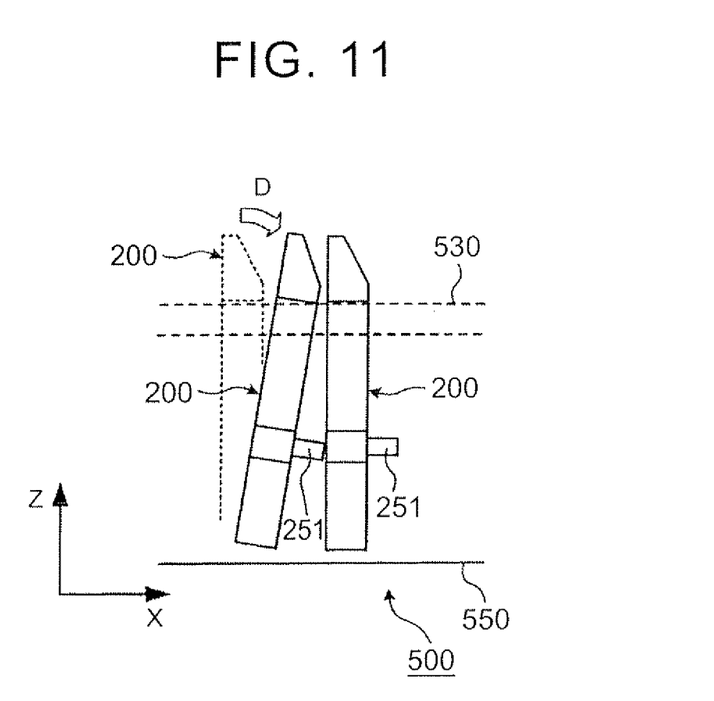
FIG. 11 is a view that illustrates a state where the partition board is inclined.

According to the present embodiment, when the plurality of partition boards 200 are caused to move in the X1 direction (see FIG. 7), it is possible to suppress inclination of each partition board 200 with the use of the pins 232, 242. For example, if the pins 232, 242 are omitted, there is a concern that each partition board 200 inclines in the arrow D direction as shown in FIG. 11. In FIG. 11, the partition board 200 indicated by the dashed line shows a state before the partition board 200 inclines in the arrow D direction.

Here, when each partition board 200 has the pins 232, 242, it is possible to suppress inclination of each partition board 200 in the arrow D direction. Specifically, it is possible to inhibit inclination of each partition board 200 in the arrow D direction by the contact of the pins 232, 242 with the guide members 530.

By providing the pins 232, 242, it becomes easy to ensure contact area between each partition board 200 and the guide members 530. That is, in comparison with the configuration that only the guide surfaces 233, 243 are brought into contact with the guide members 530, it is possible to increase contact area between each partition board 200 and the guide members 530. Thus, it is possible to stably slide each partition board 200 along the guide members 530.

In the present embodiment, the pins 232, 242 are respectively provided along the extensions of the guide surfaces 233, 243; however, they are not limited to these configurations. That is, the pins 232, 242 just need to be provided on the same side (specifically, right side in FIG. 5) as the pins 251, 261 with respect to the board body 210, and located above the pins 251, 261.

As shown in FIG. 11, if the pins 232, 242 are omitted, there is a concern that each partition board 200 inclines in the arrow D direction. In order to suppress such inclination of each partition board 200, as described above, the pins 232, 242 just need to be provided on the same side as the pins 251, 261 with respect to the board body 210, and located above the pins 251, 261.

In the present embodiment, the four pins 232, 242, 251, 261 are used; however, it is not limited to this configuration. The number of the pins provided at each partition board 200 may be set as needed. The pins 251, 261 are used to position the partition board 200 in the X direction; however, when at least one pin is used, it is possible to position the partition board 200. In addition, the pins 232, 242 have the function of suppressing inclination of the partition board 200; however, when at least one pin is used, it is possible to suppress inclination of the partition board 200.

What is claimed is:

1. A partition board to be arranged between two electrical storage elements that are arranged adjacent to each other in a predetermined direction, comprising:
   a guide portion configured to cause the partition board to move in the predetermined direction when each electrical storage element is arranged onto the partition board, the partition board being arranged along a guide member that extends in the predetermined direction, the guide portion contacting the guide member such that the partition board moves along the guide member;
   a first pin protruding in the predetermined direction, the first pin being configured to position the partition board in the predetermined direction, the first pin contacting an adjacent partition board and regulating a clearance between the partition board and the adjacent partition board when the partition board and the adjacent partition board are arranged in the predetermined direction; and
   a second pin provided at a location different in a top to bottom direction of the partition board from a location at which the first pin is provided, and the second pin protruding in the same direction as the direction in which the first pin protrudes.

2. The partition board according to claim 1, wherein the guide portion and the second pin respectively have surfaces at grade, the surfaces extending in the predetermined direction.

3. The partition board according to claim 1, wherein the length of the first pin in the predetermined direction is equal to the length of the second pin in the predetermined direction.

4. The partition board according to claim 3, wherein the length of each of the first pin and the second pin in the predetermined direction is smaller than the thickness of each electrical storage element in the predetermined direction.

5. The partition board according to claim 1, wherein a plurality of the first pins and a plurality of the second pins are provided.

6. The partition board according to claim 5, wherein the center of gravity of the partition board is located within a region surrounded by the plurality of first pins and the plurality of second pins.

7. The partition board according to claim 1, wherein
the first pin and the second pin protrude from a same surface of the partition board at a same position along the predetermined direction.

8. A partition board to be arranged between two electrical storage elements that are arranged adjacent to each other in a predetermined direction, comprising:
a board body;
a lower arm portion provided at a lower peripheral portion of the board body;
an upper arm portion provided at an upper peripheral portion of the board body, the lower arm portion and the upper arm portion extending in a first direction perpendicular to the predetermined direction;
a first pin protruding from the lower arm portion in the predetermined direction; and
a second pin protruding from the upper arm portion in the predetermined direction,
the upper arm portion being provided at a location different in a second direction from a location at which the first pin is provided, the second direction being perpendicular to the first direction and the predetermined direction, and
the first pin contacting an adjacent partition board and regulating a clearance between the partition board and the adjacent partition board when the partition board and the adjacent partition board are arranged in the predetermined direction.

9. The partition board according to claim 8, wherein
the partition board is arranged along a guide member that extends in the predetermined direction, and a lower surface of the upper arm portion contacts the guide member.

10. The partition board according to claim 8, wherein
the first pin and the second pin protrude from a same surface of the partition board at a same position along the predetermined direction.

11. A method of restraining a plurality of electrical storage elements arranged in a predetermined direction in an electrical storage device that includes the plurality of electrical storage elements and a plurality of partition boards, each of which is arranged between any adjacent two of the electrical storage elements in the predetermined direction, comprising:
regulating a clearance between the any adjacent two of the partition boards in the predetermined direction by a first pin provided at each of the partition boards;
inserting each electrical storage element into between the any adjacent two of the partition boards in the predetermined direction; and
applying restraint force in the predetermined direction to the electrical storage elements, wherein
when each of the partition boards is caused to move in the predetermined direction by a guide portion provided at each of the partition boards, inclination of each partition board with respect to the predetermined direction is suppressed by a second pin that is provided at a location different in a top to bottom direction of each partition board from a location at which the first pin is provided, and the second pin protrudes in the same direction as the direction in which the first pin protrudes.

* * * * *